United States Patent
Chih et al.

(10) Patent No.: US 7,257,023 B2
(45) Date of Patent: Aug. 14, 2007

(54) HYBRID NON-VOLATILE MEMORY DEVICE

(75) Inventors: Yue-Der Chih, Hsin-Chu (TW);
Chin-Huang Wang, Ping-Chen (TW)

(73) Assignee: Taiwan Semiconductor Manufacturing Co.

( * ) Notice: Subject to any disclaimer, the term of this patent is extended or adjusted under 35 U.S.C. 154(b) by 182 days.

(21) Appl. No.: 11/201,247

(22) Filed: Aug. 10, 2005

(65) Prior Publication Data
US 2007/0036004 A1 Feb. 15, 2007

(51) Int. Cl.
*G11C 11/34* (2006.01)
*G11C 16/04* (2006.01)

(52) U.S. Cl. ............ 365/185.01; 365/185.08; 365/185.11; 365/189.01

(58) Field of Classification Search ......... 365/185.01, 365/185.08, 185.11, 185.33, 189.01; 711/202; 714/8
See application file for complete search history.

(56) References Cited

U.S. PATENT DOCUMENTS

| H1915 H | * | 11/2000 | Boone et al. ............ 365/200 |
| 2005/0251617 A1 | * | 11/2005 | Sinclair et al. ............ 711/103 |
| 2006/0023550 A1 | * | 2/2006 | Pesavento ............ 365/225.7 |

* cited by examiner

*Primary Examiner*—Anh Phung
*Assistant Examiner*—Toan Le
(74) *Attorney, Agent, or Firm*—Kirkpatrick & Lockhart Preston Gates Ellis LLP

(57) ABSTRACT

The present invention discloses a memory device that includes a first memory cell array for storing one or more codes; a second memory cell array for storing one or more data, which are updated substantially more frequently than the codes; and a third memory cell array for storing address mapping information that indicates one or more locations of one or more memory cells in the second memory cell array. The second memory cell array endures substantially more programming cycles than the first memory cell array does.

20 Claims, 2 Drawing Sheets

HYBRID NON-VOLATILE MEMORY DEVICE

BACKGROUND

The present invention relates to integrated circuit (IC) designs, and more particularly to a non-volatile memory device with various types of memory cell arrays.

Flash memory is one of the most popular volatile memory devices available in the market. The flash memory provides easy and fast permanent data storage ability for electronic devices such as computers, digital cameras, and other portable devices. The flash memory is considered as a solid state device, meaning that, unlike a hard drive, it contains no moving part. The lack of moving parts allows the flash memory to provide a quicker and more reliable data storage than the hard disc drive. Thus, the flash memory has been considered as one of the candidates that has the potential to replace the hard disc drive as a mass data storage device in the future.

One technical challenge for the flash memory to function as a mass data storage device is that it needs to endure many programming cycles without failure. A typical flash memory cell includes a floating gate disposed on a gate oxide above a channel region. In a programming operation, electrons are injected through the gate oxide and trapped within the floating gate to program the memory cell with a predetermined bit value. This electron injection may cause the gate oxide's failure after many programming cycles.

High endurance flash memory has been developed in order to sustain more programming cycles. The high endurance memory cells used in such flash memory are often large in size. For example, extra components such as charge pumps may be necessary to provide the required potential for operation. Many reserve memory cells may be implemented in the flash memory for replacing the high endurance memory cells once they fail. The high endurance flash memory comes with a trade-off.

While the high endurance flash memory is good for some purposes, it is not necessary for all operations. For example, many codes within a memory device need not to be updated very often, and only some data require frequent updates. It would be more cost efficient to store these codes in memory devices, such as transitional read only memory (ROM) than in the high endurance flash memory. Storing both the codes and data in the high endurance flash memory is wasteful and cost inefficient.

It is therefore desirable to design a memory device that contains high endurance memory cells for storing frequently updated data and typical memory cells for storing less frequently updated codes in order to improve the cost efficiency.

SUMMARY

The present invention discloses a memory device. In one embodiment of the invention, the memory device includes a first memory cell array for storing one or more codes; a second memory cell array for storing one or more data, which are updated substantially more frequently than the codes; and a third memory cell array for storing address mapping information that indicates one or more locations of one or more memory cells in the second memory cell array. The second memory cell array endures substantially more programming cycles than the first memory cell array does.

The construction and method of operation of the invention, however, together with additional objectives and advantages thereof will be best understood from the following description of specific embodiments when read in connection with the accompanying drawings.

DESCRIPTION

Figure 1A:
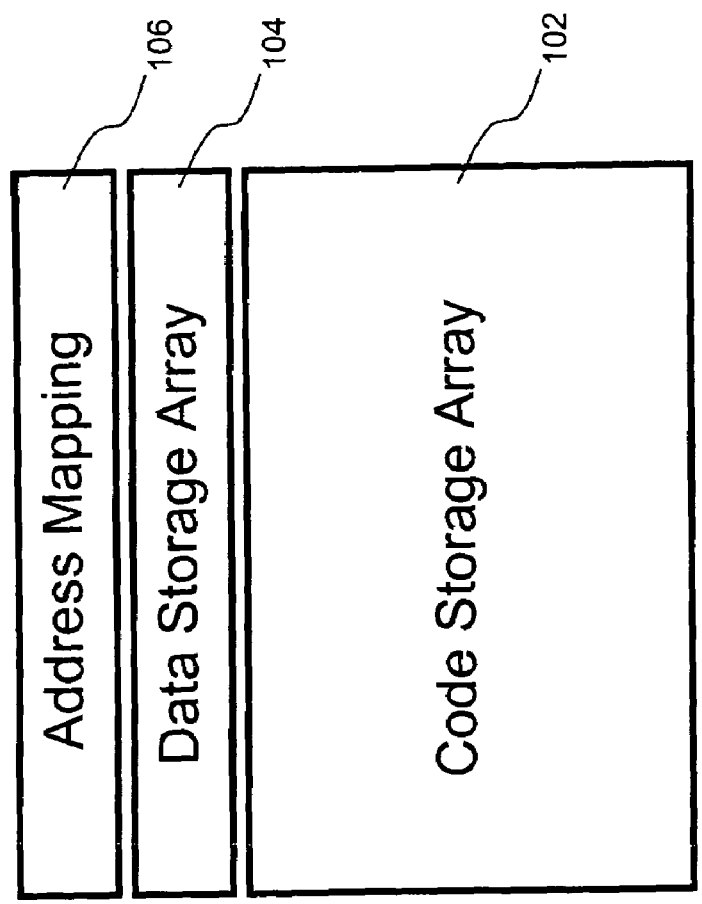
FIG. 1A illustrates a memory device that is partitioned into several memory cell arrays of different types of memory cells in accordance with one embodiment of the present invention.

FIG. 1A illustrates a non-volatile memory device 100 that is partitioned into several memory cell arrays of different types of memory cells in accordance with one embodiment of the present invention. This memory device 100 is divided into three different memory cell arrays: a code storage array 102, a data storage array 104, and an address mapping information array 106. The code storage array 102 is designated for storing codes that are less frequently updated, while the data storage array 104 is designated for storing data that are more frequently updated. The address mapping array 106 is used for storing address mapping information that indicates the physical locations of the memory cells in the data storage array 102.

The data storage array 104 is constructed by high endurance memory cells to sustain the frequent updates of the data stored therein, while the code storage array 102 is constructed by typical memory cells for storing the less frequently updated codes. As a result, the data storage array 104 is able to sustain more programming cycles than the data storage array 104. In this embodiment, the data storage array is able to endure at least 100 K programming cycles, while the code storage array 102 is only able to endure at least 1 K programming cycles.

The memory cells in the code storage array 102 can be typical one-transistor non-volatile memory cells. These one-transistor memory cells are not designed for high endurance, therefore requiring a small area to implement. Thus, they are ideal for code storage, not for data storage. The high endurance cells in the data storage array 104 can be typical two-transistor flash memory cells for sustaining more programming cycles. Thus, they are ideal for data storage, not for code storage.

These two-transistor memory cells are larger than the one-transistor cells and require more silicon area to implement. For this reason, it is important to limit the number of high endurance memory cells implemented in order to save silicon area. In many instances, information to be stored in a memory device includes not only the data, but also the codes. Thus, it would be desired to adjust the capacities of the data storage array 104 and the code storage array 102 in accommodation of the quantities of the data and codes.

The sizes of the data storage array 104 and the code storage array 102 are determined based on practical needs. Thus, the non-volatile memory device 100 can utilize the layout area more efficiently. While this embodiment only presents a data storage array 104 and a code storage array 102, it is understood that the memory device 100 can be partitioned into more memory cell arrays of various levels of endurance without departing from the spirit of the invention.

In order for a computer device to locate the different memory cell arrays within the memory device 100, an address mapping information array 106 is required to provide the computer with the locations of the memory cells for the data storage array 104. The interaction between the computer device and the non-volatile memory device 100 is detailed in reference with FIG. 1B.

Figure 1B:
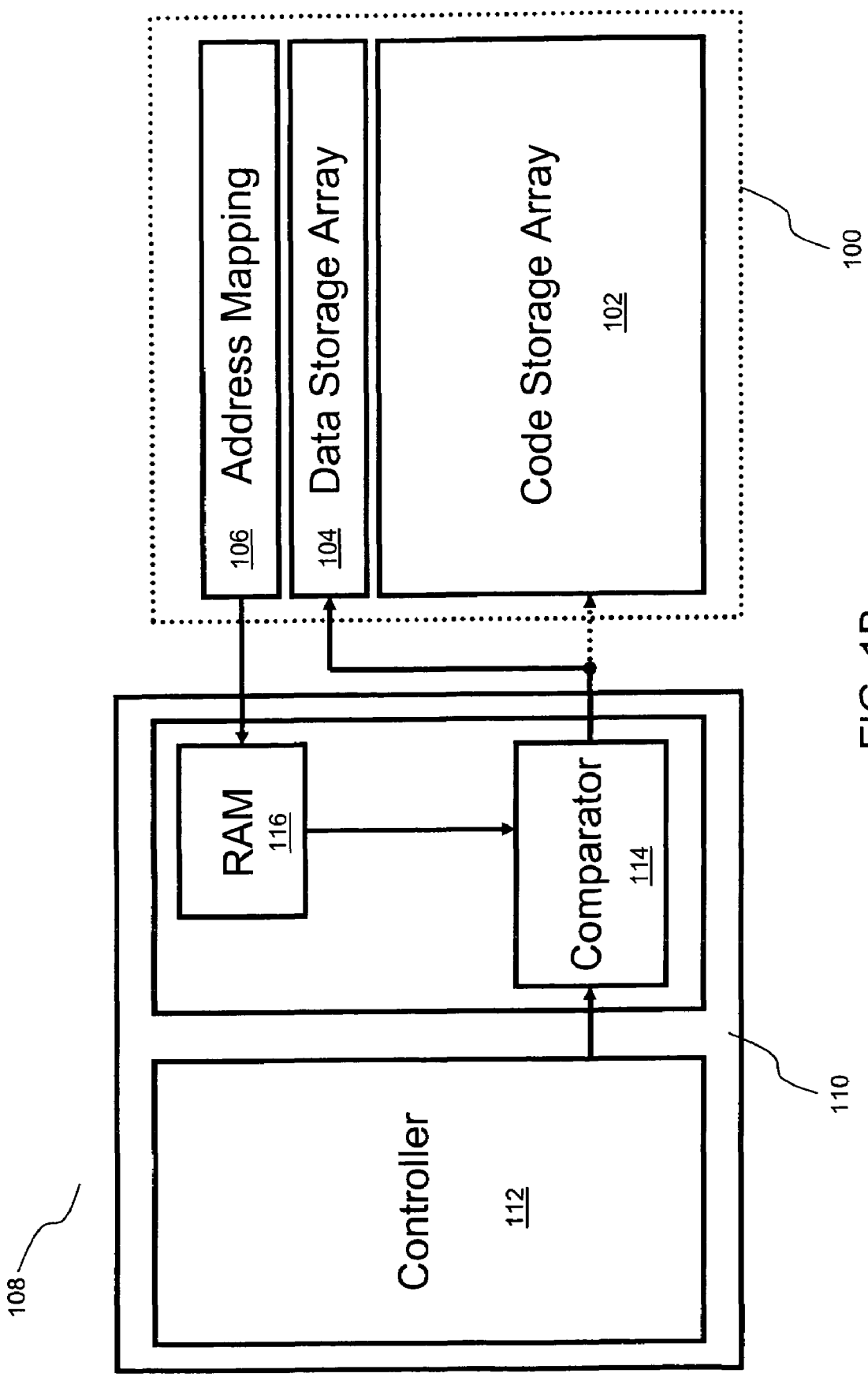
FIG. 1B illustrates a diagram showing a micro-processing system using the memory device illustrated in FIG. 1A in accordance with another embodiment of the present invention.

FIG. 1B illustrates a micro-processing system 108 using the non-volatile memory device 100 as illustrated in FIG. 1A in accordance with another embodiment of the present invention. The device 110, designed to interact with the non-volatile memory array 100, includes a controller 112, a comparator 114, and a volatile memory device 116, such as random-access memory (RAM). The controller 112 is capable of outputting data associated with logical addresses. The volatile memory device 116 coupled with the non-volatile memory device 100 temporarily stores the address mapping information retrieved from the address mapping array 106. The address mapping information indicates the physical locations of the memory cells in the data storage array 104. The comparator 114 coupled among the controller 112, the volatile memory device 116 and the non-volatile memory device 100 stores the data received from the controller into the data storage array 104 based on the address mapping information forwarded by the volatile memory device 116.

In operation, the information stored in the address mapping information array 106 is downloaded into the volatile memory device 116 after the device 110 is powered up. The type of memory array that will be read from and written into is decided by the controller 112. For example, when the device 110 requires the data from the data storage array 104, the comparator 114 will compare the output of the controller 112 with the address mapping information temporarily stored within the volatile memory device 116 to locate the memory cell locations in the data storage array 104. When the device 100 requires the less frequently updated codes from the code storage array 102, the comparator 114 will compare the output of the controller 112 with the address mapping information temporarily stored within the volatile memory device 116 to locate the memory cell locations in the code storage array 104.

In the embodiment of this invention, the data storage array 104 can be made of high endurance flash memory cells and the code storage array 102 can be made of typical flash memory cells. The typical flash memory cell occupies less silicon area than the high endurance flash memory cell. The high endurance flash memory cells can be called upon by using the information within the address mapping information array 106. The combination of the high endurance memory cells and the typical memory cells optimizes the area utilization and costs for the non-volatile memory device 100 that is designed to store both the frequently updated data and the less frequently updated codes.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. A memory device comprising:
   a first memory cell array for storing one or more codes;
   a second memory cell array for storing one or more data, which are updated substantially more frequently than the codes; and
   a third memory cell array for storing address mapping information that indicates one or more locations of one or more memory cells in the second memory cell array, wherein the second memory cell array endures substantially more programming cycles than the first memory cell array does.

2. The memory device of claim 1 wherein the first memory cell array endures at least 1 K programming cycles.

3. The memory device of claim 1 wherein the second memory cell array endures at least 100 K programming cycles.

4. The memory device of claim 1 wherein a memory cell in the second memory cell array occupies a larger area than a memory cell in the first memory cell array does.

5. The memory device of claim 1 wherein the memory cell in the first memory cell array is a one-transistor memory cell.

6. The memory device of claim 1 wherein the memory cell in the second memory cell array is a two-transistor memory cell.

7. The memory device of claim 1 wherein the memory cell in the third memory cell is a one-transistor memory cell.

8. A non-volatile memory device comprising:
   a first memory cell array for storing one or more codes;
   a second memory cell array for storing one or more data, which are updated more frequently than the codes, the second memory cell array enduring substantially more programming cycles than the first memory cell array; and
   a third memory cell array for storing address mapping information that indicates one or more locations of one or more memory cells in the second memory cell array, wherein a memory cell in the second memory cell array occupies a larger area than a memory cell in the first memory cell array does.

9. The non-volatile memory device of claim 8 wherein the first memory cell array endures at least 1 K programming cycles.

10. The non-volatile memory device of claim 8 wherein the second memory cell array endures at least 100 K programming cycles.

11. The non-volatile memory device of claim 8 wherein the memory cell in the first memory cell array is a one-transistor memory cell.

12. The non-volatile memory device of claim 8 wherein the memory cell in the second memory cell array is a two-transistor memory cell.

13. The non-volatile memory device of claim 8 wherein the memory cell in the third memory cell is a one-transistor memory cell.

14. A micro-processing system comprising:
   a controller for outputting one or more data associated with one or more logical addresses;
   a non-volatile memory device having a first memory cell array for storing one or more codes, a second memory cell array for storing the data, which are updated more frequently than the codes, and a third memory cell array for storing address mapping information that indicates one or more physical locations of one or more memory cells in the second memory cell array;

a volatile memory device coupled with the non-volatile memory device for temporarily storing the address mapping information retrieved from the third memory cell array; and a comparator coupled among the controller, the volatile memory device and the non-volatile memory device for storing the data received from the controller to the second memory cell array based on the address mapping information forwarded by the volatile memory device, wherein the second memory cell array endures substantially more programming cycles than the first memory cell array does.

15. The micro-processing system of claim 14 wherein the first memory cell array endures at least 1 K programming cycles.

16. The micro-processing system of claim 14 wherein the second memory cell array endures at least 100 K programming cycles.

17. The micro-processing system of claim 14 wherein a memory cell in the second memory cell array occupies a larger area than a memory cell in the first memory cell array does.

18. The micro-processing system of claim 14 wherein the memory cell in the first memory cell array is a one-transistor memory cell.

19. The micro-processing system of claim 14 wherein the memory cell in the second memory cell array is a two-transistor memory cell.

20. The micro-processing system of claim 14 wherein the memory cell in the third memory cell is a one-transistor memory cell.

* * * * *